United States Patent [19]
Loper

[11] Patent Number: 5,339,040
[45] Date of Patent: Aug. 16, 1994

[54] AM DEMODULATION RECEIVER USING DIGITAL SIGNAL PROCESSOR

[75] Inventor: Roger K. Loper, Marion, Iowa

[73] Assignee: Rockwell International Coproration, Seal Beach, Calif.

[21] Appl. No.: 89,864

[22] Filed: Jul. 9, 1993

[51] Int. Cl.⁵ .......................... H03D 1/02; H04B 1/26
[52] U.S. Cl. ..................................... 329/358; 329/363; 375/41; 455/323; 455/337
[58] Field of Search ................ 329/358, 363; 455/203, 455/204, 323, 337; 375/41

[56] References Cited

U.S. PATENT DOCUMENTS 4,631,485 12/1986 Torelli et al. .................... 329/358 X
5,179,731  1/1993 Tränkle et al. ................... 329/363 X

*Primary Examiner*—Siegfried H. Grimm
*Attorney, Agent, or Firm*—Kyle Eppele; M. Lee Murrah; H. Fredrick Hamann

[57] ABSTRACT

An amplitude modulated (AM) radio receiver uses a digital signal processor, responsive to in-phase (I) and quadrature-phase (Q) component signals, to compensate for carrier energy removed by a capacitive coupling circuit. A quadrature mixer converts the received AM signal to the I and Q component signals representative of the AM signal, and a signal filter passes a desired frequency segment of the I and Q component signals. A capacitive coupling circuit couples the I and Q component signals to provide representative I and Q signals with no DC bias to the input of an analog-to-digital converter. The analog-to-digital converter converts the representative unbiased I and Q signals to digital I and Q signals for processing by the digital signal processor. The digital signal processor then: (a) determines the absolute values of the I and Q digital signals; (b) compares the absolute value of the I digital signal to the absolute value of the Q digital signal and determines which value is greater; and in response to the outcome of the comparison, provides a digital output word as function of one of the following terms $$I \times (1 + ((2)^{\frac{1}{2}} - 1) |Q/I|),$$

$$Q \times (1 + ((2)^{\frac{1}{2}} - 1) |I/Q|).$$

A digital-analog converter then converts the digital output word to an analog signal representing the AM demodulated signal.

21 Claims, 3 Drawing Sheets

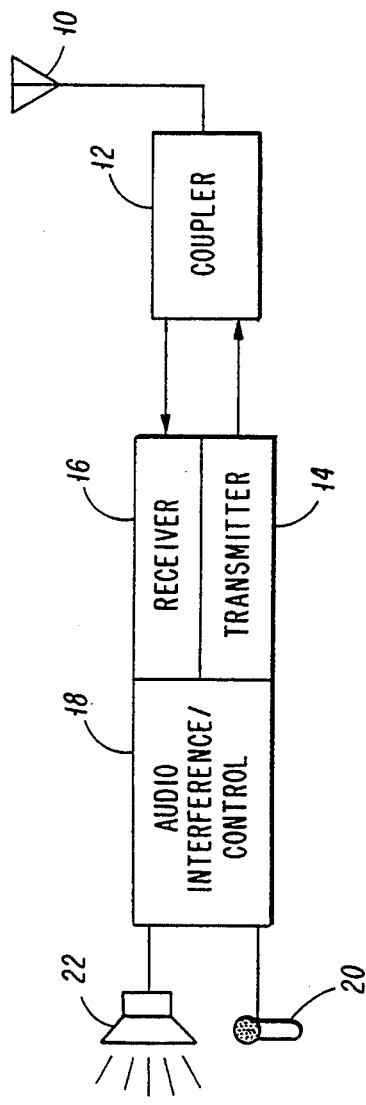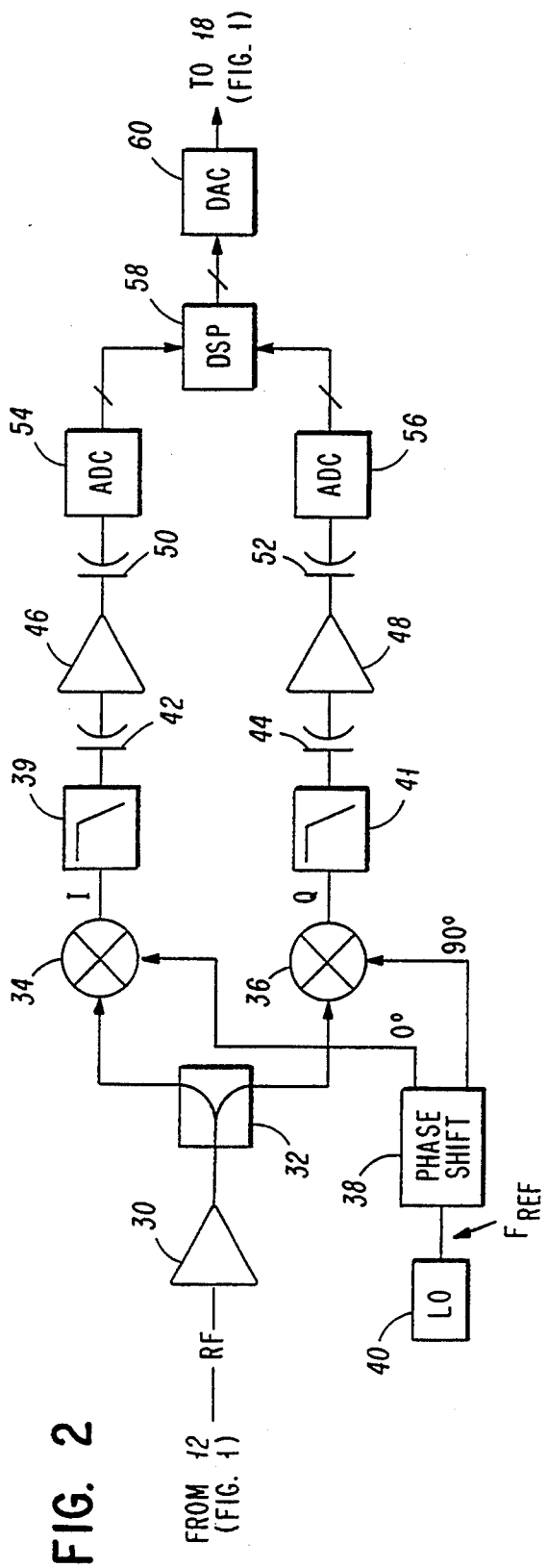

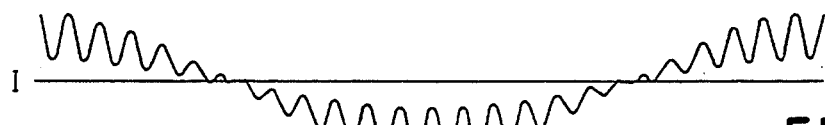
FIG. 3A
FIG. 3B
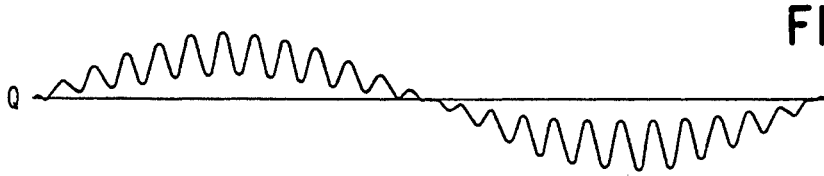
FIG. 3C
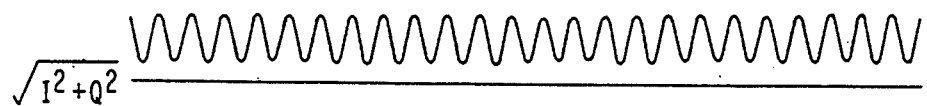
FIG. 4A
FIG. 4B
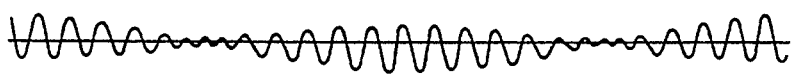
FIG. 4C
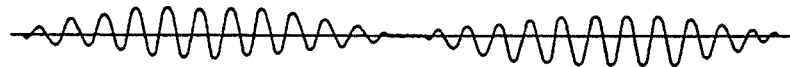
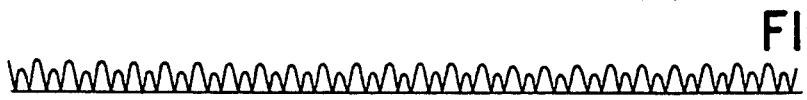
FIG. 5
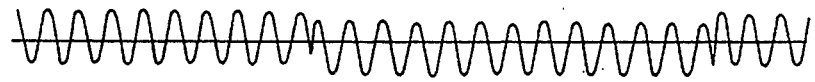
FIG. 6
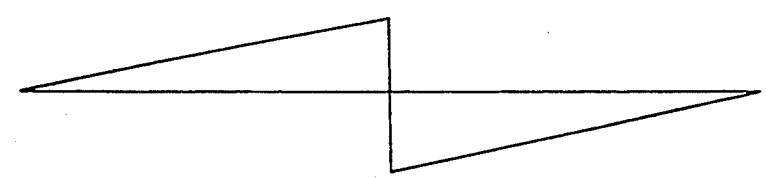
FIG. 7
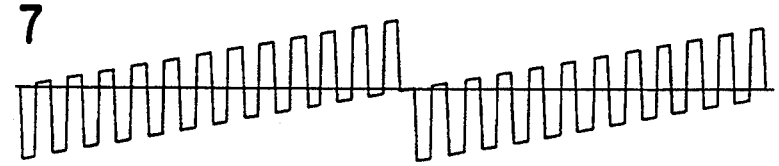

AM DEMODULATION RECEIVER USING DIGITAL SIGNAL PROCESSOR

FIELD OF THE INVENTION

The present invention relates generally to amplitude-modulated (AM) radio receivers and, more particularly, to arrangements and methods of demodulating AM signals in a zero-IF radio receiver, wherein use of the term "zero-IF" refers to radios in which there is little or no intermediate frequency (IF).

BACKGROUND OF THE INVENTION

There are an increasing number of radio applications requiring communication over a wide frequency spectrum, for example, 30–400 megahertz. Radios having circuitry which performs conversion of the received AM signal directly to the audio signal, without first mixing down to IF, are commonly referred to as direct conversion, or zero-IF, receivers.

Using this type of reception, some form of AC coupling or high pass filtering is necessary to remove the inevitable DC offset resulting from the mixing and amplification circuitry in the front end of the receiver. If the signal received is an AM signal and if the translated carrier frequency falls below the corner frequency of the AC coupling, the carrier component of the signal becomes attenuated. Use of conventional AM demodulation algorithms results in a certain degree of distortion in the signal at the demodulated output of the receiver. In many applications, the degree of distortion involved is entirely unacceptable and has required extensive filtering and reconstruction of the received signal.

There is therefore a need for an arrangement and method of demodulating an AM signal in a zero-IF radio receiver which overcomes the afore-mentioned deficiencies.

SUMMARY OF THE INVENTION

The present invention overcomes the shortcomings of the prior art by providing an arrangement and method of AM demodulation which compensates for loss of carrier energy resulting from an AC coupling circuit, thereby accurately estimating the original modulating signal. By evaluating the information on the in-phase (I) and quadrature-phase (Q) components representing the received AM signal and taking the I or Q component output that has the larger absolute value at any given time, an approximation to the desired modulation function can be obtained which is significantly more accurate than known demodulation techniques. Further improvement in the accuracy of the approximation can be achieved by scaling the output based upon the ratio of the absolute values of the I and Q component signals.

In accordance with another aspect of the present invention, an AM radio receiver includes a quadrature mixer converting a received AM signal to I and Q component signals representative of the AM signal; a signal filter passing a desired frequency segment of the I and Q component signals; a capacitive coupling circuit coupling the I and Q component signals to provide representative I and Q component signals with no DC bias; an analog-to-digital converter converting the representative I and Q signals to digital I and Q signals; and a digital signal processor (a) determining the absolute values of the I and Q digital signals, (b) comparing the absolute value of the I digital signal to the absolute value of the Q digital signal and determining which value is greater, and (c) in response to the step of comparing and determining, providing a digital output as function of $$I \times (1 + (2)^{\frac{1}{2}} - 1) |Q/I|, \text{ or}$$

$$Q \times (1 + (2)^{\frac{1}{2}} - 1) |I/Q|.$$

A converting circuit then processes the digital output to an analog signal representing the AM demodulated signal, so as to compensate for carrier energy removed by the capacitive coupling circuit.

In accordance with yet another aspect of the present invention, a method for demodulating an AM signal includes processing the digital I and Q component signals to compensate for carrier energy removed from the amplitude modulated signal by the AC-coupling. The method is particularly useful in a direct conversion receiver which converts the AM signal to I and Q component signals representative of the AM signal, and AC-couples the component signals to provide representative digital I and Q component signals without DC bias. The method includes the steps of: (a) analyzing a parameter associated with the carrier frequency of the AM signal and comparing the parameter to a prescribed threshold level; (b) in response to determining that the parameter has exceeded the prescribed threshold level: (b)(1) determining the absolute values of the I and Q digital signals, comparing the absolute values of the I and Q signals; (b)(2) in response to determining that the absolute value of the I signal is greater than the absolute value of the Q signal, providing as an output a first digital word representing $I \times (1 + (2)^{\frac{1}{2}} - 1) |Q/I|$; (b)(3) in response to determining that the absolute value of the Q signal is greater than the absolute value of the I signal, providing a second digital word as an output representing $$Q \times (1 + (2)^{\frac{1}{2}} - 1) |I/Q|; \text{ and}$$

(c) converting the output word to an analog signal representing the AM demodulated signal.

In yet another implementation, a digital signal processor provides an output as function of the square root of the sum of the squares of I and Q, or $((I^2 + Q^2))^{\frac{1}{2}}$, if the frequency of the AM signal is above a predetermined compensation-frequency threshold, or if the energy of the carrier signal is sufficiently large that such compensation is not needed.

The above summary is not intended to describe each aspect of the present invention, as this is the purpose of the discussion that follows.

BRIEF DESCRIPTION OF THE DRAWINGS

FIG. 1 is a block diagram of a radio system including a zero-IF radio receiver for demodulating an AM signal, in accordance with the present invention.

FIG. 2 is an expanded block diagram of the zero-IF radio receiver section of FIG. 1.

FIGS. 3A and 3B are timing diagrams showing I and Q components of an AM signal in the zero-IF radio receiver section of FIG. 2.

FIG. 3C is a timing diagram showing an ideal recovery of the modulating information represented in the timing diagrams of FIGS. 3A and 3B.

FIGS. 4A and 4B are timing diagrams showing I and Q components of an AM signal in the zero-IF radio receiver section of FIG. 2, when AC coupling in the receiver results in attenuation of the translated carrier.

FIG. 4C is a timing diagram showing a recovered modulating signal, corresponding to the I and Q components of the timing diagrams of FIGS. 4A and 4B, when processing the I and Q components in accordance with prior art techniques of signal recovery.

FIG. 5 is a timing diagram showing a recovered modulating signal, corresponding to the I and Q components of the timing diagrams of FIGS. 4A and 4B, when processing the I and Q components in accordance with the present invention and using, for example, the arrangement shown in FIG. 1.

FIG. 6 is a timing diagram showing an arctangent (Q/I) phase calculation for an AM signal, corresponding to the I and Q components of the timing diagrams of FIGS. 3A and 3B, with no loss of beat frequency.

FIG. 7 is a timing diagram showing an arctangent (Q/I) phase calculation for an AM signal, in accordance with the prior art and corresponding to the I and Q components of the timing diagrams of FIGS. 4A and 4B.

DETAILED DESCRIPTION OF THE SPECIFIC EMBODIMENTS

Figure 8A:
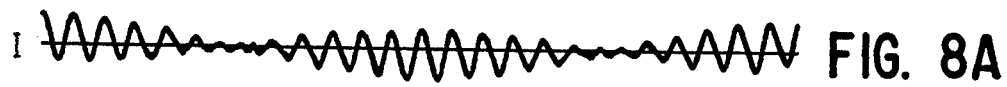
FIGS. 8A–8E comprise a series of timing diagrams for I and Q components of an AM signal and a series of calculations to obtain an accurate estimation of the phase associated therewith, according to the present invention.

Turning now to FIG. 1, a radio system shown according to one implementation of the present invention includes an antenna 10, a coupler 12 coupling the antenna 10 to an AM transmitter section 14 and to an AM direct conversion radio receiver section 16. An audio interface/control section 18 couples audio (and data) from a microphone 20 to the transmitter section 14, and from the AM direct conversion radio receiver section 16 to a speaker 22.

The direct conversion radio receiver section 16 is shown in expanded form in FIG. 2 to include a radio-frequency (RF) amplifier 30 amplifying the RF AM signal received by the coupler (12 of FIG. 1), and an RF splitter 32 splitting the amplified AM signal into respective inputs for a pair of conventional quadrature mixers 34 and 36. Each quadrature mixer 34, 36 adds and subtracts the frequencies at its frequency inputs, which are the output from the RF splitter 32 and an output from a phase shifter 38. The phase shifter 38 acts as a delay circuit, so as to produce two virtually identical reference signals having a 90 degree phase differential.

The phase shifter 38 generates its phase-shifted outputs based on the output of a local oscillator 40, which provides a reference signal ($F_{ref}$) having a frequency which is substantially equal to the frequency of the received AM signal. Generally, the frequency of the reference signal generated by the local oscillator 40 will not be exactly equal to the received AM signal due to inaccuracies in frequency generation in both the transmitter (sourcing the RF AM signal) and the local oscillator 40 in the receiver.

By mixing the reference signal ($F_{ref}$) and the received AM signal, each quadrature mixer 34, 36, therefore, produces a first AM signal having a frequency approximately twice the frequency at which the AM signal was received (resulting from addition) and a second AM signal having a frequency which is approximately zero (resulting from subtraction). The second AM signal is a demodulated signal having the modulating audio (or data) information, but also including carrier difference frequency, or beat note frequency, resulting from the difference in frequency between the reference signal ($F_{ref}$) and the received AM signal. The quadrature mixer 34 produces an I component of the received AM signal, and the quadrature mixer 36 produces a Q component, which lags the phase of the I component by 90 degrees, of the received AM signal.

To remove the first AM signal, which has the undesired doubled frequency, low pass filters 39 and 41 are used at the respective outputs of the quadrature mixers 34 and 36. The desired second AM signal screened by the low pass filters 39 and 41, is then AC-coupled by capacitors 42 and 44 to remove the inevitable DC offset that occurs as a result of the function of the mixers 34, 36 and the baseband amplifier 30. Since there are many types of DC-bias-removing capacitive networks, use of a single series-capacitor for each of the I and Q component paths is not critical. After further amplification by amplifiers 46 and 48, the DC-bias contributed by the amplifiers 46 and 48 is removed by capacitors 50 and 52, and each of the I and Q components of the AM signal is presented to respective analog-to-digital converters (ADC) 54 and 56 for conversion to the digital domain.

Except for the operation of a digital signal processor (DSP) 58, which processes the digital outputs of the ADC 54 and 56, the block diagram of FIG. 1 illustrates a conventional direct conversion AM receiver. This is an important aspect of the present invention, because it permits the present invention to be implemented in many currently existing radio designs. In a conventionally operating DSP receiving signals consistent with the AC-coupling of FIG. 1, amplitude modulation is recovered by having a DSP perform the following operation on the digital I and Q components of the AM signal:

$$AM = ((I^2 + Q^2))^{\frac{1}{2}} \qquad \text{(Equation No. 1)}.$$

The problem with many existing designs using the above equation to recover the modulating information concerns the effect of the AC coupling, as represented by either of the capacitive circuits (42, 44 or 50, 52) for the respective I and Q components of the AM signal. Because the corner frequency of the I and Q components of the modulating information can be quite low, typically below 1 Hz, it is not uncommon for the capacitive circuit to attenuate part of the translated "carrier," or beat note, frequency caused by the nonexact reference frequency ($F_{ref}$ of FIG. 2). This results in distortion to the recovered modulating information.

FIGS. 3A and 3B show the I and Q component signals at the input of the ADC for a received AM signal with 50 percent sine-wave amplitude modulation. The beat note frequency is considerably less than the modulation frequency, but is still passed unattenuated by the AC coupling. Because the beat note frequency is not attenuated, the resultant recovered information is as shown in FIG. 3C, which is not distorted.

If the AC coupling results in attenuation of the translated carrier frequency, the results are as shown in FIG. 4C. FIG. 4C corresponds to a received AM signal, as represented by the timing diagrams of FIGS. 4A and 4B, having a 90 percent reduction in the carrier amplitude. This level of distortion is obviously undesired. In the limit, where the beatnote disappears completely, the modulating information is full wave rectified by the demodulation algorithm of equation 1. As illustrated in FIGS. 4A and 4B, a substantial portion of either the I or Q component signal looks much like the desired demodulated signal (FIG. 3C).

Another important aspect of the present invention provides a technique for overcoming the type of distortion illustrated in FIG. 4C. If the output is taken to be whichever channel, I or Q, has the larger absolute value at any given time, an accurate approximation to the desired modulation function is obtained. Further improvement in the accuracy of the approximation can be achieved by scaling this output approximation based upon the ratio of the absolute values of the I and Q signals.

For example and in accordance with the present invention, significant improvement in the quality of the recovered modulating signal is provided using the following demodulation algorithm. First, determine the absolute values of the I and Q component signals. Next, compare the absolute value of the I component signal to the absolute value of the Q component signal and determine which value is greater. In response to this comparison and determination, provide as an output from the DSP a digital output word $$= I \times (1 + ((2)^{\frac{1}{2}} - 1) |Q/I|) \quad \text{(Equation No. 2)},$$

if the absolute value of the I digital signal is greater than the absolute value of the Q digital signal. Or provide as an output from the DSP a digital output word $$= Q \times (1 + ((2)^{\frac{1}{2}} - 1) |I/Q|) \quad \text{(Equation No. 3)},$$

if the absolute value of the Q digital signal is greater than the absolute value of the I digital signal.

Preferably, each of the above steps is executed by a logic device such as a DSP 58, programmed accordingly. An acceptable DSP is commercially available from Analog Devices Inc., of Norwood, MA Part No. ADSP2101.

As each digital word is output from the DSP, an DAC (60 of FIG. 2) converts the digital output word to an analog signal representing the AM demodulated signal, so as to compensate for carrier energy removed by the capacitive coupling circuit.

FIG. 5 illustrates the results of this demodulation algorithm using the same signal situation discussed in connection with FIGS. 4A and 4B. The demodulation algorithm of equation no. 1 is preferably used when the signal has a sufficiently high beat note frequency to survive the high pass filtering (or AC coupling) functions of the receiver. When this is not the case, the algorithm of equation nos. 2 and 3 is preferably used. This is because there is a phase inversion of the demodulated output twice in each cycle of the beat note (inversions occur at beat note phases of 135 and 315 degrees), as shown in FIG. 5. The small amount of energy at the beat note frequency (generally less than 1 Hz) does not survive either the receiver automatic gain control function or the post-demodulation filtering of many AM receivers. For most AM receiver applications, the phase of the demodulated output is not critical.

Determining which AM demodulation algorithm to use requires a determination of beat note frequency. In the cases where the beat note is high enough in frequency that it is not attenuated by the AC coupling, there is no degradation and, therefore, no reason to use the algorithm of equations no. 2 and 3.

FIG. 6 shows the results of signal phase calculation using the following relationship for the same signal situation as shown in FIGS. 4A and 4B:

$$\text{phase} = \text{arctangent } (Q/I) \quad \text{(Equation No. 4)}.$$

If there is attenuation of the beat note, the algorithm of equation 4 gives the erratic results as shown in FIG. 7.

Figure 8B:
Figure 8C:
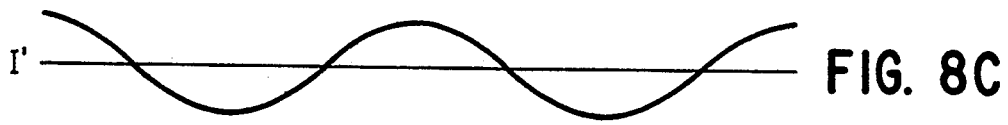
Figure 8D:
Figure 8E:
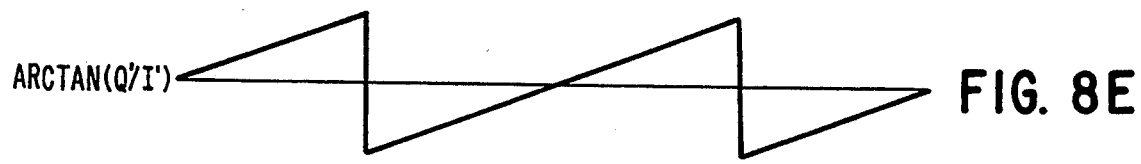

FIGS. 8A to 8E illustrate a method of measuring signal phase, in accordance with the present invention, that is immune to the problems illustrated in FIG. 7. The waveforms labeled I', Q' and "ARCTAN" are obtained from the following relationships:

$$I' = (I^2 - Q^2) / (I^2 + Q^2) \quad \text{(Equation No. 5)}$$

$$Q' = (2 \times I \times Q) / (I^2 + Q^2) \quad \text{(Equation No. 6)}$$

$$\text{Phase} = \text{arctangent } (2 \times I \times Q) / (I^2 - Q^2) \quad \text{(Equation No. 7)}$$

The I' and Q' derivations are totally immune to AM modulation and also to loss of beatnote frequency. They are always unity-amplitude sine and cosine waves. They are representative of twice the beat note frequency, but the primary purpose for measuring phase is to ascertain that there is a certain minimum rate of phase change. It should be noted that if the signal is at zero-beat and the beat note disappears entirely, and if there is also no modulation on the signal, there is no signal at all and the I and Q components will also disappear. In this case, however, the demodulation method is also of no concern since either method will give the desired output of "nothing".

Accordingly, the present invention provides various degrees of accuracy to compensate for attenuation to the translated carrier caused by the AC-coupling in a conventional receiver section of an AM radio.

Those skilled in the art will readily recognize that various modifications and changes may be made to the present invention, without departing from the true spirit and scope thereof, which is set forth in the following claims.

I claim:

1. In an AM receiver converting an AM signal to in-phase (I) and quadrature-phase (Q) component signals representative of the AM signal, and AC-coupling the component signals to provide representative digital I and Q signals, a method of demodulating the AM signal including processing the digital I and Q signals to compensate for carrier signal energy removed from the amplitude modulated signal by the AC-coupling, the method comprising the steps of:

(a) determining the absolute values of the I and Q digital signals;
  (b) comparing the absolute value of the I digital signal to the absolute value of the Q digital signal and determining which value is greater;
  (c) in response to said step of comparing and determining, providing a digital output by scaling the greater value based upon the ratio of the absolute values of the I and Q digital signals; and
  (d) converting the digital output to an analog signal representing the AM demodulated signal.

2. A method of demodulating an AM signal, according to claim 1, further including performing one of the following steps: determining if the frequency of the AM signal is below a predetermined compensation-frequency threshold before executing step (c); and detecting an energy level corresponding to the carrier signal and comparing the energy level to a threshold level.

3. A method of demodulating an AM signal, according to claim 2, further including not executing step (c) if the energy level corresponding to the carrier frequency is above the threshold level.

4. A method of demodulating an AM signal, according to claim 2, further including not executing step (c) if the frequency of the AM signal is above the predetermined compensation-frequency threshold.

5. A method of demodulating an AM signal, according to claim 2, further including executing the following step instead of step (c): providing a digital output as function of the square root of $(I^2+Q^2)$, if the frequency of the AM signal is above the predetermined compensation-frequency threshold.

6. A method of demodulating an AM signal, according to claim 2, further including executing the following step instead of step (c): providing a digital output as function of the square root of $(I^2+Q^2)$, if the energy level corresponding to the carrier frequency is above the threshold level.

7. A method of demodulating an AM signal, according to claim 1, further including calculating said digital output using a digital signal processor.

8. In a direct conversion receiver receiving an AM signal, converting the AM signal to in-phase (I) and quadrature-phase (Q) component signals representative of the AM signal, and AC-coupling the component signals to provide representative digital I and Q signals, a method of demodulating the AM signal including processing the digital I and Q signals to compensate for carrier signal energy removed from the amplitude modulated signal by the AC-coupling, the method comprising the steps of:

(a) analyzing a parameter associated with the carrier frequency of the AM signal and comparing said parameter to a prescribed threshold level;

(b) in response to determining that the parameter has exceeded the prescribed threshold level:

(b)(1) determining the absolute values of the I and Q digital signals, comparing the absolute values of the I and Q signals to determine if the absolute value of the I digital signal is greater than the absolute value of the Q digital signal;

(b)(2) in response to determining that the absolute value of the I signal is greater than the absolute value of the Q signal, providing as an output a first digital word representing $$I \times (1+((2)^{\frac{1}{2}}-1) |Q/I|;$$

(b)(3) in response to determining that the absolute value of the Q signal is greater than the absolute value of the I signal, providing as an output a second digital word representing $$Q \times (1+((2)^{\frac{1}{2}}-1) |I/Q|;  \text{ and}$$

(c) converting the output to an analog signal representing the AM demodulated signal.

9. A method of demodulating an AM signal, according to claim 8, wherein said parameter includes the frequency of the AM signal.

10. A method of demodulating an AM signal, according to claim 8, wherein said parameter includes an energy level corresponding to the carrier signal.

11. A method of demodulating an AM signal, according to claim 8, further including executing the following step instead of step (b): providing as an output a digital output word representing the square root of $(i^2+Q^2)$, if the parameter has not exceeded the prescribed threshold level.

12. A method of demodulating an AM signal, according to claim 11, wherein said parameter includes at least one of the following: the frequency of the AM signal, and an energy level corresponding to the carrier signal.

13. A method of demodulating an AM signal, according to claim 11, further including calculating said digital output word using a digital signal processor.

14. An AM receiver, comprising
a quadrature mixer converting a received AM signal to in-phase (I) and quadrature-phase (Q) component signals representative of the AM signal;
a signal filter passing a desired frequency segment of the I and Q component signals;
a capacitive coupling circuit coupling the I and Q component signals to provide representative I and Q signals with no DC bias;
an analog-to-digital converter converting the representative I and Q signals with no DC bias to digital I and Q signals;
a digital signal processor
(a) determining the absolute values of the I and Q digital signals;
(b) comparing the absolute value of the I digital signal to the absolute value of the Q digital signal and determining which value is greater;
(c) in response to said step of comparing and determining, providing a digital output by scaling the greater value based upon the ratio of the absolute values of the I and Q digital signals; and
a circuit converting the digital output to an analog signal representing the AM demodulated signal, so as to compensate for carrier signal energy removed by the capacitive coupling circuit.

15. An AM receiver, according to claim 14, wherein the digital signal processor analyzes a parameter associated with the carrier frequency of the AM signal and compares said parameter to a prescribed threshold level before providing the digital output word, and wherein the digital signal processor provides the digital output word as function of one of the following terms $$I \times (1+((2)^{\frac{1}{2}}-1) |Q/I|) , \text{ and}$$

$$Q \times (1+((2)^{\frac{1}{2}}-1) |I/Q|)$$

16. An AM receiver, according to claim 15, wherein said parameter includes at least one of the following: the frequency of the AM signal, and an energy level corresponding to the carrier signal.

17. An AM receiver, according to claim 15, wherein the digital signal processor executes the following step instead of step (c): provides a digital output word as function of the square root of $(I^2+Q^2)$, if the parameter has not exceeded the prescribed threshold level.

18. An AM receiver, according to claim 14, wherein the digital signal processor compares the absolute values of the I and Q signals to determine if the absolute value of the I digital signal is greater than the absolute value of the Q digital signal, and in response to determining that the absolute value of the I signal is greater than the absolute value of the Q signal, provides as an output word a first digital word representing $$I \times (1+((2)^{\frac{1}{2}}-1)\ |Q/I|).$$

19. An AM receiver, according to claim 14, wherein the digital signal processor compares the absolute values of the I and Q signals to determine if the absolute value of the I digital signal is greater than the absolute value of the Q digital signal, and in response to determining that the absolute value of the Q signal is greater than the absolute value of the I signal, provides as an output word a first digital word representing $$Q \times (1+((2)^{\frac{1}{2}}-1)\ |I/Q|),$$

20. An AM receiver, according to claim 14, wherein the digital signal processor compares the absolute values of the I and Q signals to determine if the absolute value of the I digital signal is greater than the absolute value of the Q digital signal, and in response to said comparison:

providing as an output word a first digital word representing $$I \times (1+((2)^{\frac{1}{2}}-1)\ |Q/I|)$$

if the absolute value of the I signal is greater than the absolute value of the Q signal, and providing as an output word a second digital word representing $$Q \times (1+((2)^{\frac{1}{2}}-1)\ |I/Q|$$

if the absolute value of the Q signal is greater than the absolute value of the I signal.

21. A method of demodulating an AM signal, according to claim 2, wherein the step of determining if the frequency of the AM signal is below a predetermined compensation-frequency threshold includes calculating the derivative with respect to time of the arctangent $[(2 \times I \times Q)/(I^2 \times Q^2)]$.

* * * * *